(12) United States Patent
Ricci (10) Patent No.: US 8,242,005 B1
(45) Date of Patent: Aug. 14, 2012

(54) USING MULTIPLE MASKS TO FORM INDEPENDENT FEATURES ON A WORKPIECE

(75) Inventor: Justin M. Ricci, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/012,492

(22) Filed: Jan. 24, 2011

(51) Int. Cl.
*H01L 21/265* (2006.01)

(52) U.S. Cl. . 438/519; 438/527; 438/531; 257/E21.056; 257/E21.057; 257/E21.058

(58) Field of Classification Search .................. 438/510, 438/514, 519, 517, 531, 527; 257/E21.056, 257/E21.057, E21.058, E21.059
See application file for complete search history.

(56) References Cited

U.S. PATENT DOCUMENTS

| | | | |
|---|---|---|---|
| 4,330,932 A | 5/1982 | Morris et al. | |
| 6,184,111 B1 | 2/2001 | Henley et al. | |
| 6,930,316 B2 | 8/2005 | Nishihashi et al. | |
| 7,727,866 B2 | 6/2010 | Bateman et al. | |
| 7,820,460 B2 | 10/2010 | Sullivan et al. | |
| 2002/0050573 A1* | 5/2002 | Suguro et al. | 250/492.21 |
| 2006/0258128 A1 | 11/2006 | Nunan et al. | |
| 2008/0017243 A1 | 1/2008 | De Ceuster et al. | |
| 2008/0029818 A1* | 2/2008 | Steegen et al. | 257/351 |
| 2010/0059362 A1 | 3/2010 | Anella | |
| 2010/0062589 A1 | 3/2010 | Anella et al. | |
| 2011/0186118 A1* | 8/2011 | Kim | 136/256 |
| 2011/0192993 A1 | 8/2011 | Chun et al. | |

FOREIGN PATENT DOCUMENTS

| | | |
|---|---|---|
| WO | 2010120765 A2 | 10/2010 |
| WO | 2010147997 A2 | 12/2010 |
| WO | 2011100363 A1 | 8/2011 |
| WO | 2011119819 A2 | 9/2011 |

\* cited by examiner

*Primary Examiner* — Khiem D Nguyen (57) ABSTRACT

A first species is directed through a first mask with a first aperture and a second mask with a second aperture. The first aperture and second aperture may be different shapes or have different spacing. The first species may be implanted in pattern defining non-implanted regions surrounded by implanted regions. These implanted regions are a sum of said first ion species implanted through said first aperture and said second aperture. Thus, the non-implanted regions are surrounded by the implanted regions formed using the first mask and second mask. The first species also may deposit on or etch the workpiece.

20 Claims, 9 Drawing Sheets

USING MULTIPLE MASKS TO FORM INDEPENDENT FEATURES ON A WORKPIECE

FIELD

This invention relates to workpiece processing and, more particularly, to forming independent features on a workpiece.

BACKGROUND

Ion implantation is a standard technique for introducing conductivity-altering impurities into a workpiece. A desired impurity material is ionized in an ion source, the ions are accelerated to form an ion beam of prescribed energy, and the ion beams is directed at the surface of the workpiece. The energetic ions in the beam penetrate into the bulk of the workpiece material and are embedded into the lattice of the workpiece material to form an implanted region.

Solar cells are one example of a device that uses silicon workpieces. Any reduced cost to the manufacture or production of high-performance solar cells or any efficiency improvement to high-performance solar cells would have a positive impact on the implementation of solar cells worldwide. This will enable the wider availability of this clean energy technology.

Photoresist may be used to block ions that are implanted into a workpiece, such as a solar cell. However, adding and removing photoresist adds additional process steps and extra costs to solar cell manufacturing. Shadow or stencil masks held on or above a workpiece may be used to implant various patterns without additional process steps, which may increase throughput and decrease cost for solar cell manufacturing. However, a single shadow or stencil mask is limited in the shape or pattern of the possible selective implants. More complex patterns of apertures, such as those that can be formed using photoresist on a workpiece, cannot be manufactured in a single shadow or stencil mask. Accordingly, what is needed is an improved method and apparatus to process workpieces and, more particularly, an improved method and apparatus to form independent features on a workpiece, such as a solar cell.

SUMMARY

According to a first aspect of the invention, a method to manufacture a workpiece is provided. The method comprises directing a first species through a first aperture in a first mask toward a workpiece. The first species also is directed through a second aperture in a second mask toward the workpiece. The first mask and second mask are spaced apart from the workpiece. This first species forms a pattern defining a plurality of is independent regions surrounded by a processed region. The processed region is a sum of the first species directed through the first aperture and the second aperture.

According to a second aspect of the invention, a method to implant a workpiece is provided. The method comprises selectively implanting a first ion species into a workpiece to form a first pattern. The first ion species also is selectively implanted into a workpiece to form a second pattern. The second pattern is disposed between the first pattern. The first pattern and the second pattern define a plurality of non-implanted regions surrounded by the first pattern and the second pattern.

According to a third aspect of the invention, an ion implanter is provided. The ion implanter comprises an ion source. A wafer holder is downstream of the ion source. A first mask defines at least a first aperture and a second mask, different from the first mask, defines at least a second aperture. A mask transfer mechanism is configured to dispose the first mask and the second mask in front of the wafer holder.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments herein are described in connection with solar cells. However, these embodiments can be used with semiconductor wafers, flat panels, or other workpieces. For example, a microelectromechanical system (MEMS) or silicon-on-insulator (SOI) workpiece may be processed using embodiments disclosed herein. Furthermore, while ion implantation is specifically disclosed, the embodiments herein also may be applied to etching, deposition, or other processing steps for workpieces. In these cases, the workpiece has portions etched or removed or has layers added or deposited instead of having ions implanted, though the patterns are similar to those illustrated in FIGS. 4-9 or others described herein. These etching or deposition processes may or may not use an ion implanter, ions, or a plasma. Thus, the invention is not limited to the specific embodiments described below.

Figure 1:
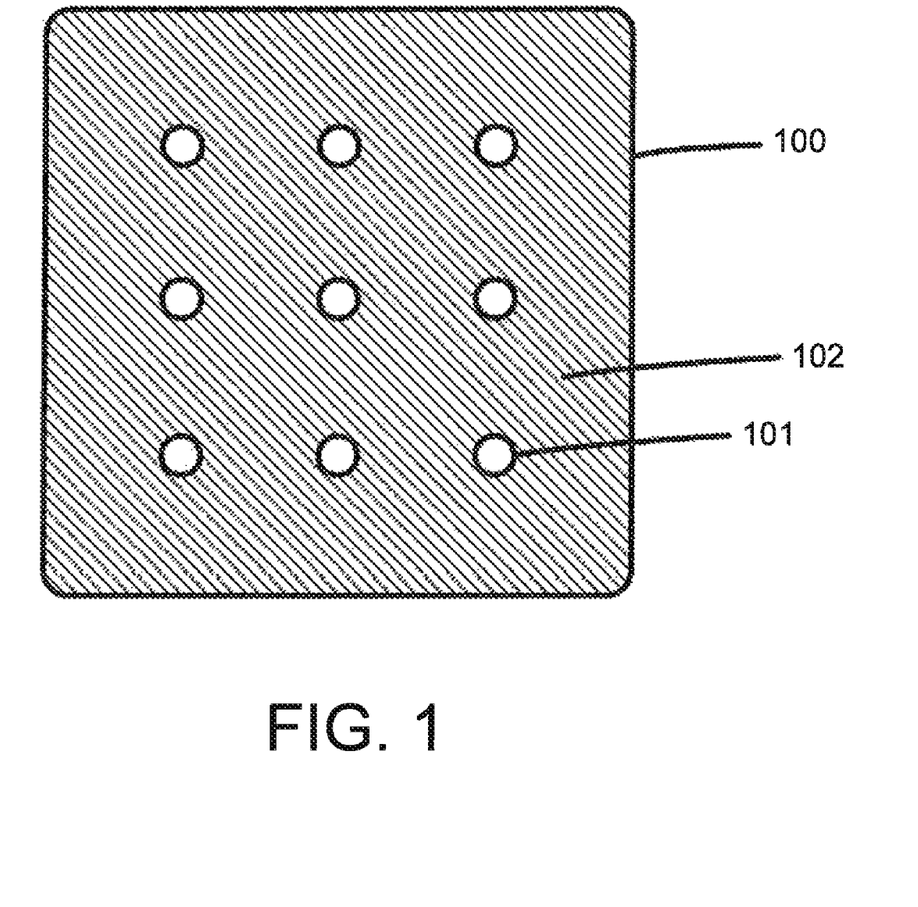
FIG. 1 is a front perspective view of a solar cell with selective doping.

FIG. 1 is a front perspective view of a solar cell with selective doping. The workpiece 100 is a solar cell in this instance, but is not limited solely to a solar cell. The workpiece 100 has a doped region 102 (illustrated by the region with the slash marks) and non-doped regions 101. The non-doped regions 101 are independent and do not contact each other. Such a solar cell may later be further doped or manufactured and be metallized to have "point contacts." These point contacts may be placed over the non-doped regions 101 in one instance, such as after further doping within the non-doped regions 101. While ion implantation may be used for the doping to form the doped region 102, it is difficult to design a single stencil mask or shadow mask that only blocks the non-doped regions 101.

Figure 2:
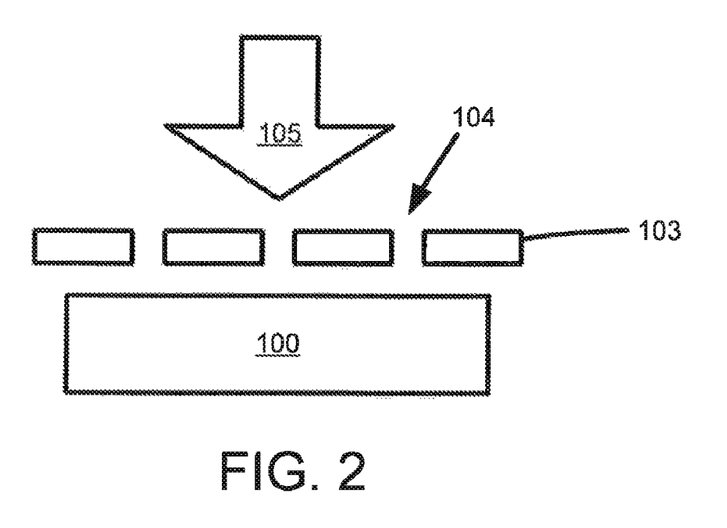
FIG. 2 is a cross-sectional view of a first implantation step.

Two masks may be used to implant a pattern similar to that illustrated in FIG. 1. FIG. 2 is a cross-sectional view of a first implantation step. A first mask 103 having at least one first aperture 104 is disposed between the source of the first ions 105 and the workpiece 100. The number of the first apertures 104 may vary. The first mask 103 may be disposed upstream of or may directly contact the workpiece 100. The first ions 105 are implanted through the first apertures 104. The first mask 103 blocks the first ions 105 from implanting the workpiece 100 in regions where doping is not desired. These first ions 105 may be n-type or p-type dopants, but also may be other implant species known to those skilled in the art. As, P, B, C, He, Si, and Ge are some examples.

Figure 3:
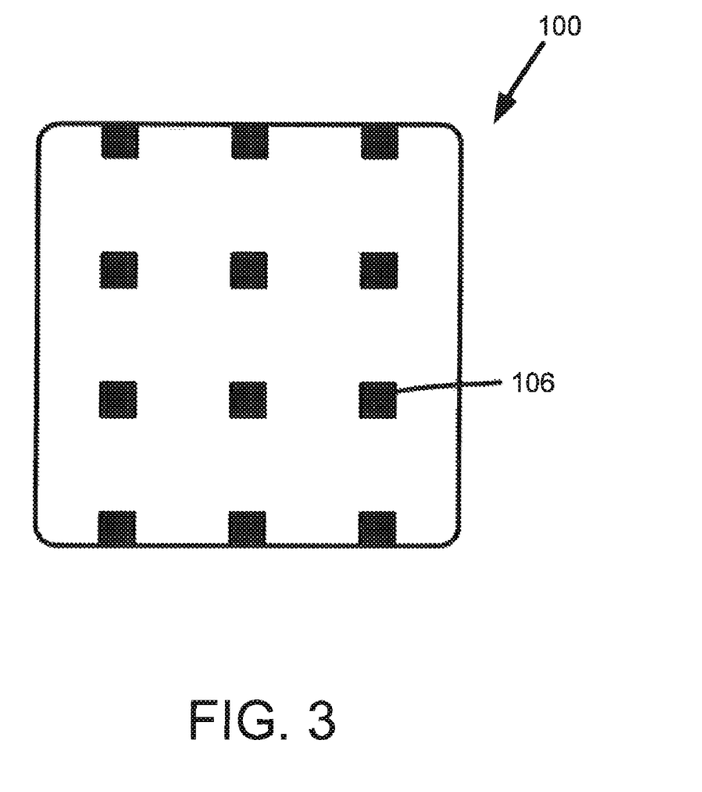
FIG. 3 is a front perspective view of the solar cell after the implantation illustrated in FIG. 2.

FIG. 3 is a front perspective view of the solar cell after the implantation illustrated in FIG. 2. The first apertures 104 illustrated in FIG. 2 align with the first pattern 106 in FIG. 3 (illustrated by the shaded blocks). The remainder of the workpiece 100 is not implanted with the first species 105. This particular workpiece 100 is not illustrated to scale. The dimensions of the first pattern 106 and those of any subsequent implant may vary.

Figure 4:
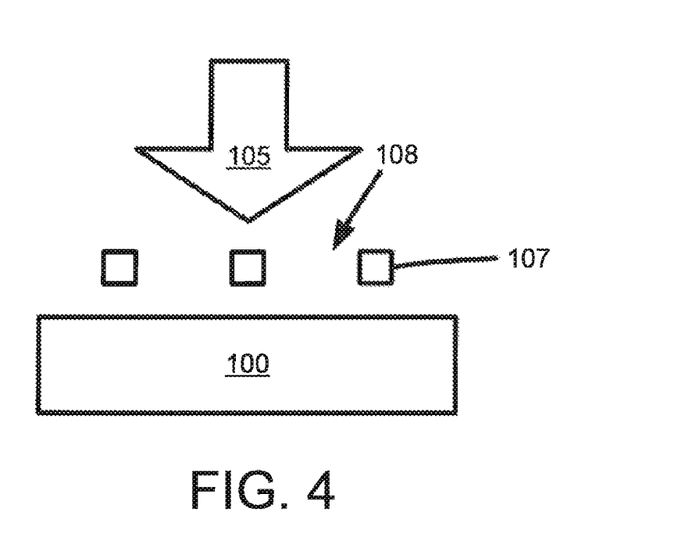
FIG. 4 is a cross-sectional view of a second implantation step.

FIG. 4 is a cross-sectional view of a second implantation step. Of course, the implant steps of FIG. 2 and FIG. 4 may be performed in either order. A second mask 107 having at least one second aperture 108 is disposed between the source of the first ions 105 and the workpiece 100. The number of the second apertures 108 may vary. The second mask 107 may be disposed upstream of or may directly contact the workpiece 100. The first ions 105 are implanted through the second apertures 108 in the second mask 107. The second mask 107 blocks the first ions 105 from implanting the workpiece 100 in regions where doping is not desired. In one instance, the first ions 105 are implanted at the same dose and energy through both the first mask 103 of FIG. 2 and the second mask 107 of FIG. 4. The distance between the workpiece 100 and the first mask 103 of FIG. 2 and the second mask 107 of FIG. 4 may be the same. In another embodiment, the distance between the workpiece 100 and the first mask 103 of FIG. 2 and the second mask 107 of FIG. 4 may be the different. Different distances may allow some overlap between the various implanted regions in the workpiece 100, may enable a higher dose in various implanted regions in the workpiece 100, or may be needed if different implant species are used with the first mask 103 and second mask 107.

Figure 5:
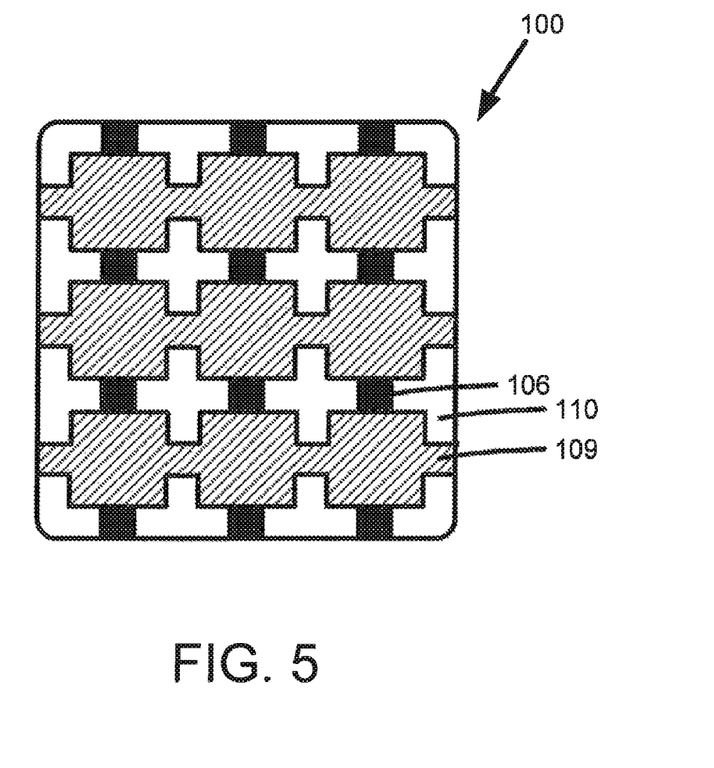
FIG. 5 is a front perspective view of the solar cell after the implantation illustrated in FIG. 4.

FIG. 5 is a front perspective view of the solar cell after the implantation illustrated in FIG. 4. The second apertures 108 illustrated in FIG. 4 align with the second pattern 109 in FIG. 5 (illustrated by the slash marks). This leaves at least one non-implanted region 110 (illustrated by the blank regions). These non-implanted regions 110 do not contact one another and are independent. The non-implanted regions 110 are surrounded by the first pattern 106 and second pattern 109. Thus, the implanted area of the workpiece 100 is a sum of the first ion species 105 implanted through the first aperture 104 of FIG. 2 and the second aperture 108 of FIG. 4. There is a difference in dose between the first pattern 106 and second pattern 109 versus the non-implanted region 110. In one embodiment, the dose in the first pattern 106 and second pattern 109 is approximately the same. While the first pattern 106 and second pattern 109 are illustrated in FIG. 5 as being distinct, the first pattern 106 and second pattern 109 can at least partially overlap in an alternate embodiment. This may enable a grade in various dopants.

Figure 6:
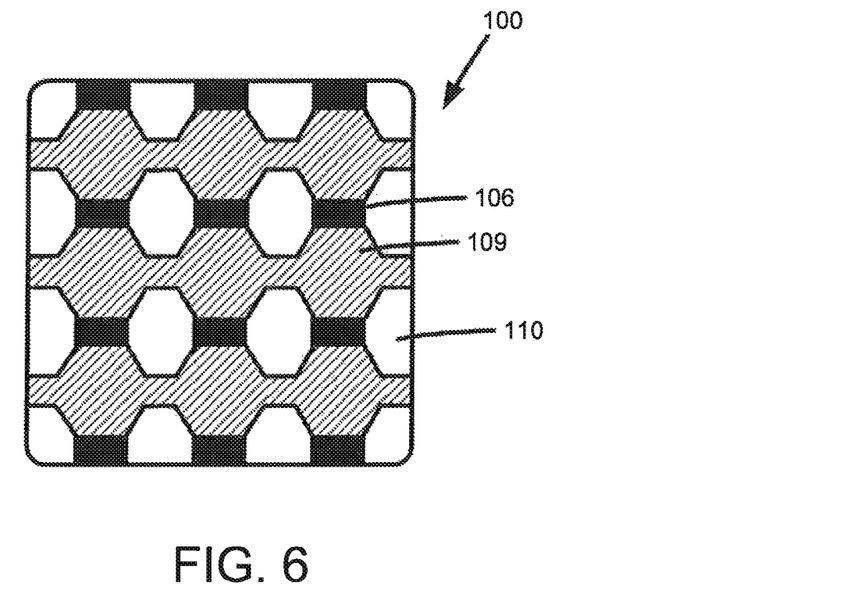
FIG. 6 is a front perspective view of a second embodiment of an implanted solar cell.

The non-implanted region 110 can have varying shapes or dimensions, FIG. 6 is a front perspective view of a second embodiment of an implanted solar cell. In this particular embodiment, the non-implanted regions 110 are hexagonal. Of course, other polygonal shapes may be formed.

Figure 7:
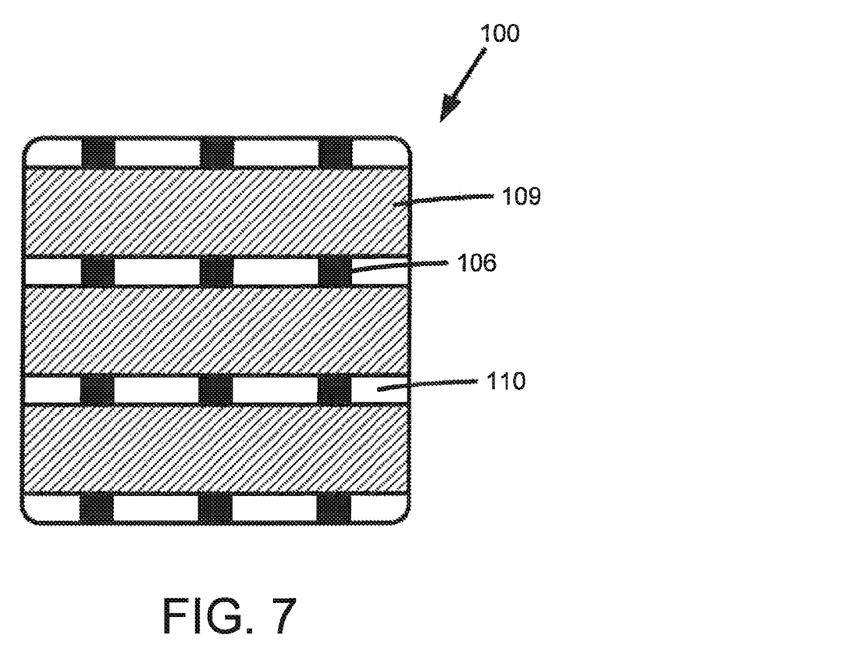
FIG. 7 is a front perspective view of a third embodiment of an implanted solar cell.

FIG. 7 is a front perspective view of a third embodiment of an implanted solar cell. In this particular embodiment, the non-implanted regions 110 are rectagonal. The dimensions of the non-implanted regions 110 may vary. In an alternate embodiment, the non-implanted regions 110 are staggered with respect to one another, meaning that the non-implanted regions 110 in the various rows do not line up or match.

Figure 8:
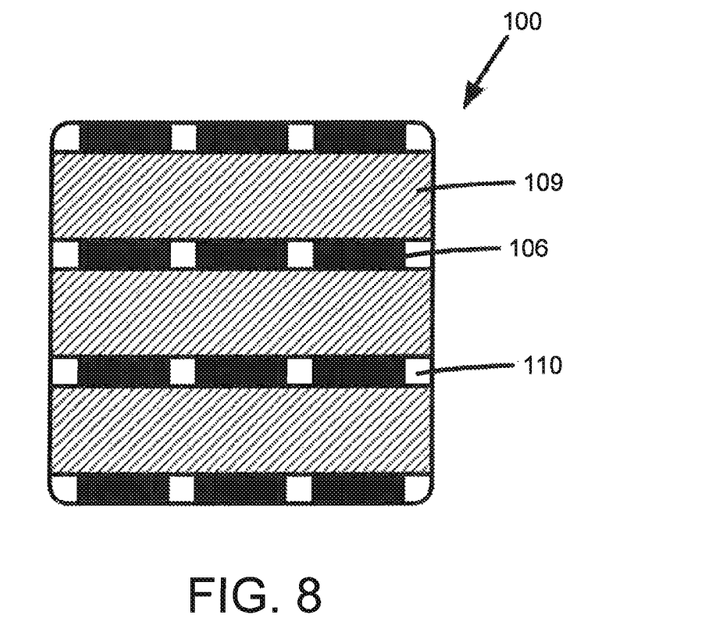
FIG. 8 is a front perspective view of a fourth embodiment of an implanted solar cell.

FIG. 8 is a front perspective view of a fourth embodiment of an implanted solar cell. In this particular embodiment, the non-implanted regions 110 are square. In an alternate embodiment, the non-implanted regions 110 are staggered with respect to one another, meaning that the non-implanted regions 110 in the various rows do not line up or match.

Figure 9:
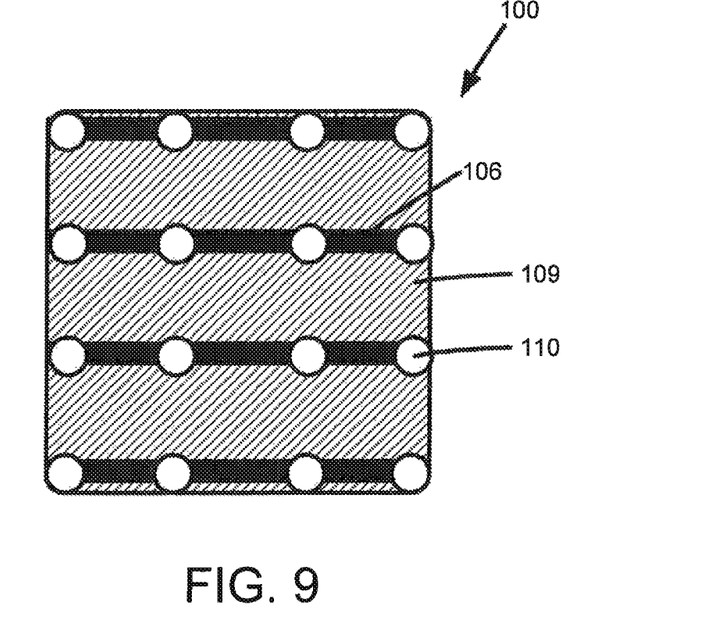
FIG. 9 is a front perspective view of a fifth embodiment of an implanted solar cell.

FIG. 9 is a front perspective view of a fifth embodiment of an implanted solar cell. In this particular embodiment, the non-implanted regions 110 are circular. The dimensions of the non-implanted regions 110 may vary. The non-implanted regions 110 of FIG. 9 may correspond to the non-doped regions 101 of FIG. 1 in one instance.

In the embodiments of FIGS. 6-9, the first mask and second mask used to form the first pattern 106 and second pattern 109 may have apertures that substantially match the first pattern 106 and second pattern 109. In an alternate embodiment, the first pattern 106 and second pattern 109 at least partially overlap and the apertures in the first mask and second mask may vary to allow for this overlap. Other shapes for the non-implanted regions 110 are possible and the embodiments disclosed herein are meant to be merely illustrative.

In one particular embodiment, the first mask and second mask used for these implants are composed of graphite or silicon carbide. Of course, other materials known to those skilled in the art that will not affect or contaminate the workpiece 100 may be used. The outermost dimensions of the first mask and second mask may be the same in one instance. In one embodiment, the first apertures 104 and second apertures 108 may have dimensions between approximately 100 μm and approximately 800 μm.

Figure 12:
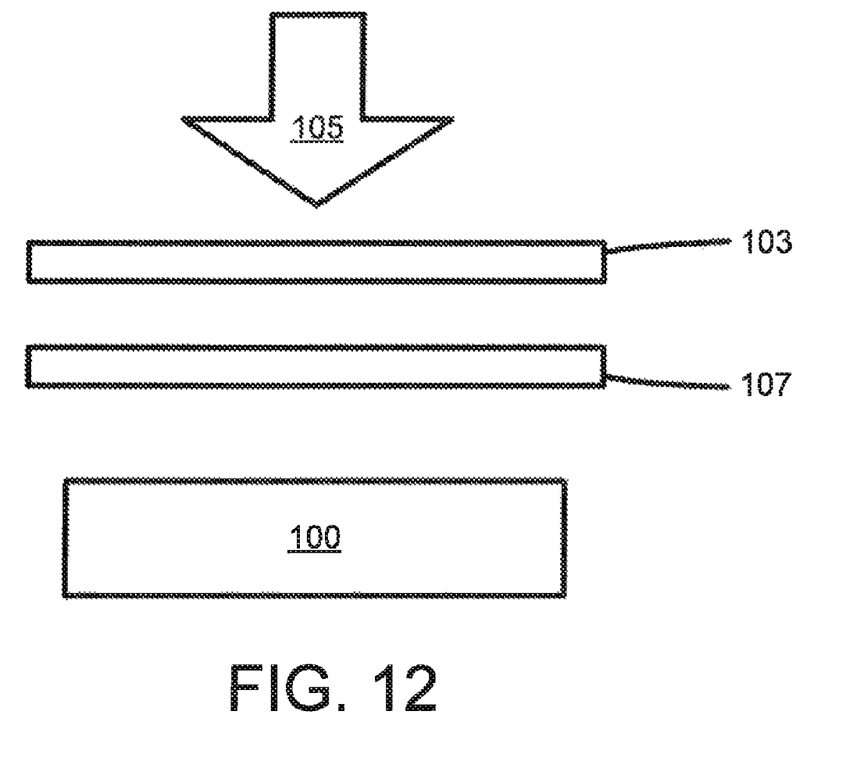
FIG. 12 is a cross-sectional view of a second embodiment of an implantation step.

In another embodiment, three or more masks are used to form a particular shape of the non-implanted regions 110. Each mask may have a separate implant step. While two implant steps are disclosed in FIGS. 2-5, in an alternate embodiment at least the first mask 103 and second mask 107 are aligned and the first ions 105 are implanted through both the first mask 103 and second mask 107 simultaneously. FIG. 12 is a cross-sectional view of a second embodiment of an implantation step. The first mask 103 and second mask 107 are aligned. The apertures within the first mask 103 and second mask 107 (not illustrated) are positioned such that the workpiece 100 is implanted as illustrated in, for example, FIGS. 5-9. Also, while two distinct masks are illustrated in the embodiments herein, a single mask with two or more sets of apertures that can be disposed above a workpiece also may be used. Thus, the first mask 103 and second mask 107 may be incorporated into a single unit.

Figure 10:
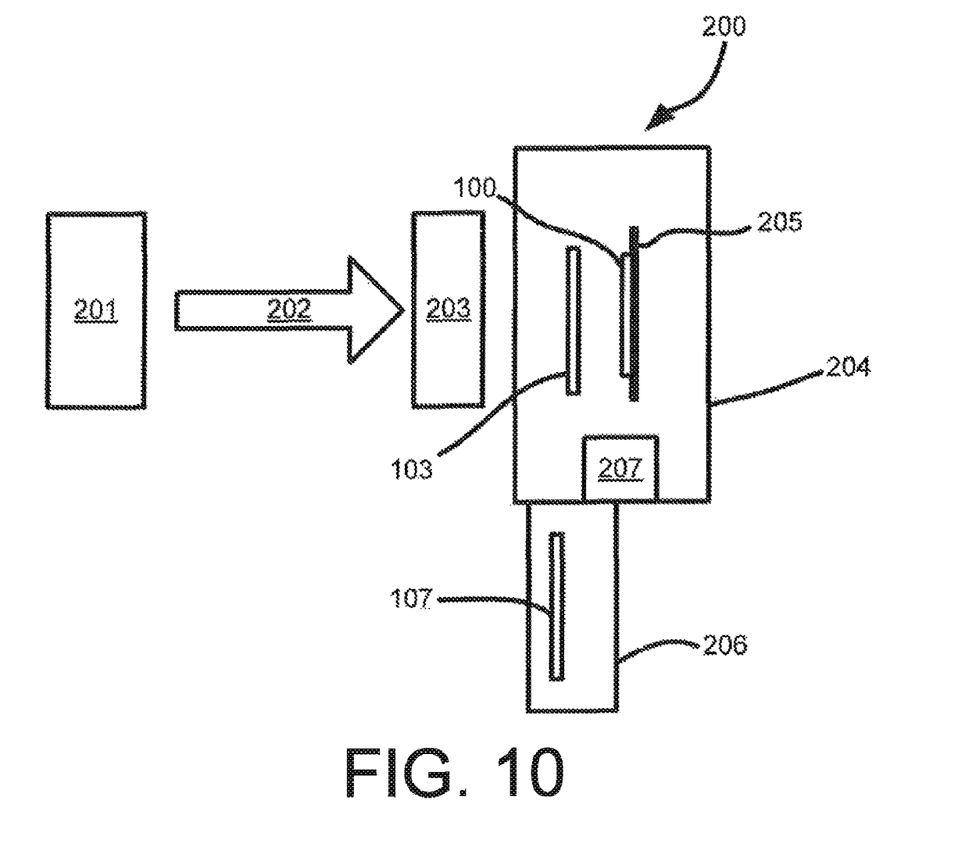
FIG. 10 is a simplified block diagram of a beam-line ion implanter.

FIG. 10 is a simplified block diagram of a beam-line ion implanter. Those skilled in the art will recognize that the beam-line ion implanter 200 is only one of many examples of differing beam-line ion implanters. In general, the beam-line ion implanter 200 includes an ion source 201 to generate ions that are extracted to form an ion beam 202, which may be, for example, a ribbon beam or a spot beam. The ion beam 202 of FIG. 10 may correspond to the first ions 105 of FIG. 2 or FIG. 4.

The ion beam 202 may be mass analyzed and converted from a diverging ion beam to a ribbon ion beam with substantially parallel ion trajectories in one instance. The ion beam 202 also may not be mass analyzed prior to implantation. The beam-line ion implanter 200 may further include an acceleration or deceleration unit 203 in some embodiments.

An end station 204 supports one or more workpieces, such as the workpiece 100, in the path of the ion beam 202 such that ions of the desired species are implanted into workpiece 100. The end station 204 may include wafer holder, such as platen 205, to support the workpiece 100. The wafer holder also may be other mechanisms such as a conveyor belt. This particular end station 204 also may include a scanner (not illustrated) for moving the workpiece 100 perpendicular to the long dimension of the ion beam 202 cross-section, thereby distributing ions over the entire surface of workpiece 100.

The beam-line ion implanter 200 may include additional components known to those skilled in the art such as automated workpiece handling equipment. Faraday sensors, or an electron flood gun. It will be understood to those skilled in the art that the entire path traversed by the ion beam is evacuated during ion implantation. The beam-line ion implanter 200 may incorporate hot or cold implantation of ions in some embodiments.

The beam-line ion implanter 200 also includes a mask storage area 206 configured to hold the first mask 103 and second mask 107. This mask storage area 206 may be, for example, a rack on a wall or some other mechanism within or near the end station 204. This mask storage area 206 also may be a separate chamber within the beam-line ion implanter 200 implanter. At least one mask transfer mechanism 207 is configured to move the first mask 103 or second mask 107 from the mask storage area 206 to be disposed in front of the workpiece 100. Of course, three or more masks may be stored in the mask storage area 206 and moved by the mask transfer mechanism 207. In one embodiment, the mask storage area 206 may have a cooling or heating mechanism to adjust the temperature of the first mask 103 or second mask 107.

The first mask 103 or second mask 107 may be moved by the mask transfer mechanism 207 vertically, horizontally, or a combination of the two with respect to the base of the beam-line ion implanter 200. The first mask 103 or second mask 107 may be rotated by the mask transfer mechanism 207 such that, for example, a first mask 103 is rotated 90° while being moved from the mask storage area 206 to in front of the workpiece 100. In a first instance, the mask transfer mechanism 207 is a robot. The mask transfer mechanism 207 may use this robot to position the first mask 103 and second mask 107 in a desired location. In a second instance, the mask transfer mechanism 207 is a rail system. This rail system is configured to transport the first mask 103 and second mask 107 such that a movement, for example vertical or horizontal, can switch between the first mask 103 and second mask 107. In other instances, the mask transfer mechanism 207 is a rotating post or rotating wheel. This mask transfer mechanism 207 may be oriented so that a rotation of 90° or other desired angular rotation around a post or pivot point would place the first mask 103 and second mask 107 in a desired location. The mask transfer mechanism 207 is configured in one embodiment to operate without breaking a vacuum within the beam-line ion implanter 206.

The first mask 103 or second mask 107 may be aligned with respect to the workpiece 100 or the platen 205. Tactile sensors, pins, a kinematic system, proximity sensors, laser systems, or other mechanisms known to those skilled in the art may be used.

One skilled in the art will recognize other systems and processes involved in workpiece manufacturing, other systems and processes involved in plasma treatment, or other systems and processes that use accelerated ions that may perform the process described herein. Some examples of this, for example, are a plasma doping tool, an ion shower, or a plasma immersion tool. Other semiconductor processing equipment known to those skilled in the art that can accelerate species and implant species into a workpiece also may be used. Thus, this process is not limited solely to beam-line ion implanters.

Figure 11:
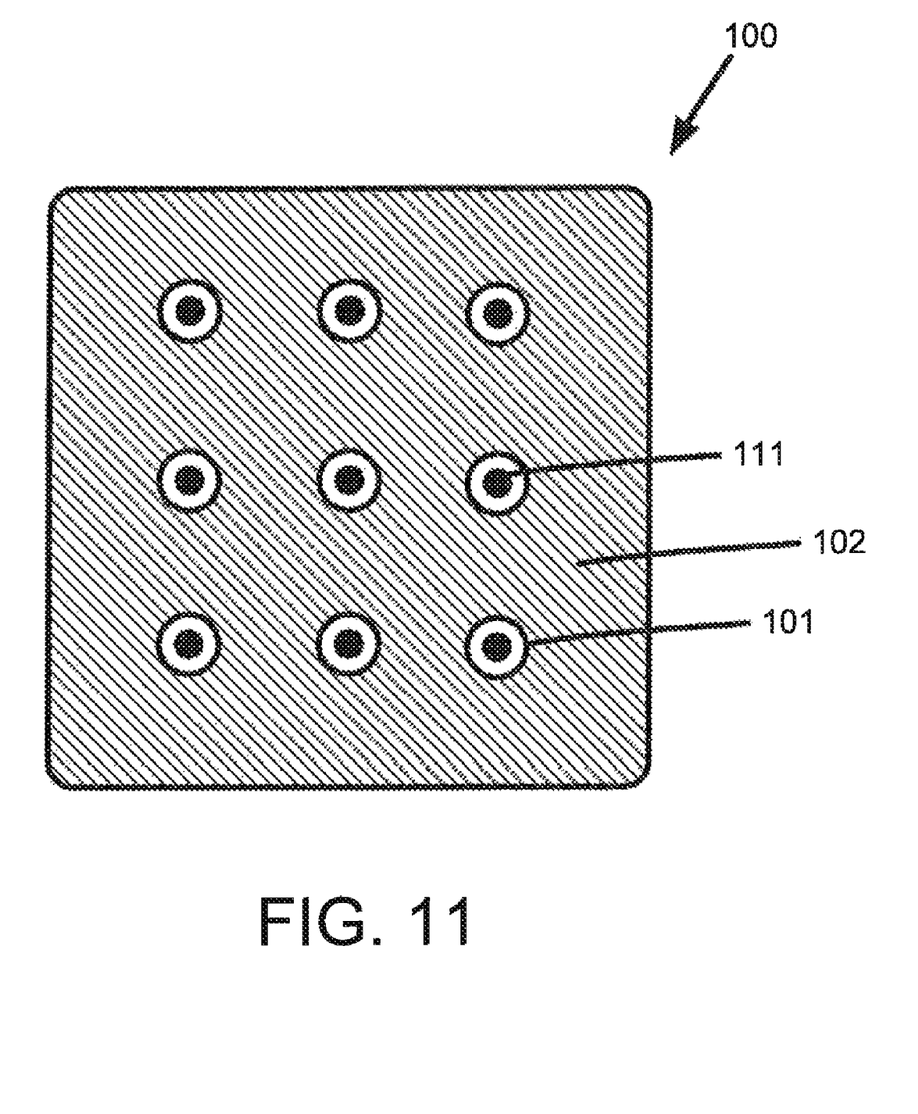
FIG. 11 is a front perspective view of a sixth embodiment of an implanted solar cell.

FIG. 11 is a front perspective view of a sixth embodiment of an implanted solar cell. FIG. 11 has been further processed with respect to the solar cell illustrated in FIG. 9. The workpiece 100 has doped region 102, formed using implantation through multiple masks and non-doped regions 101. The doped region 102 may be formed using, for example, the embodiments disclosed in FIGS. 2-5. The workpiece further has second doped regions 111. These second doped regions 11 are inside the non-doped regions 101 and do not directly contact the doped regions 102 due to the presence of the non-doped regions 101. Both the doped region 102 and second doped regions 111 may be formed using ion implantation. The second doped regions 111 may be formed using masked ion implantation in one embodiment. Such a mask used to form the second doped regions 111 may have apertures that substantially match the shape of the second doped regions 111. In one embodiment, three implant steps are performed on the workpiece 100 as illustrated in FIG. 11. The doped region 102 and second doped regions 111 may be opposite conductivities, such that one is n-type and the other is p-type.

Figure 13:
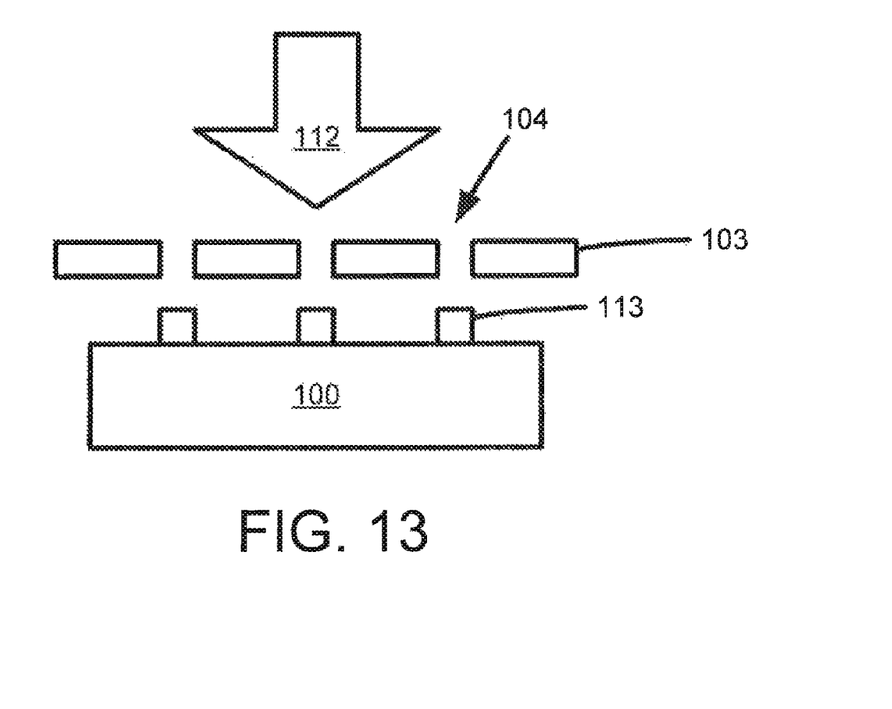
FIG. 13 is a cross-sectional view of a deposition step.

FIG. 13 is a cross-sectional view of a deposition step. In this embodiment, the first mask 103 is used with particles 112, which may be ions or neutral atoms or molecules. These form deposits 113 that are aligned with the first apertures 104. A second mask may be used as described herein to form deposits in a processed region or pattern similar to, for example, the implanted regions of FIGS. 5-9. This will leave independent non-deposited or non-processed regions on the workpiece 100.

Figure 14:
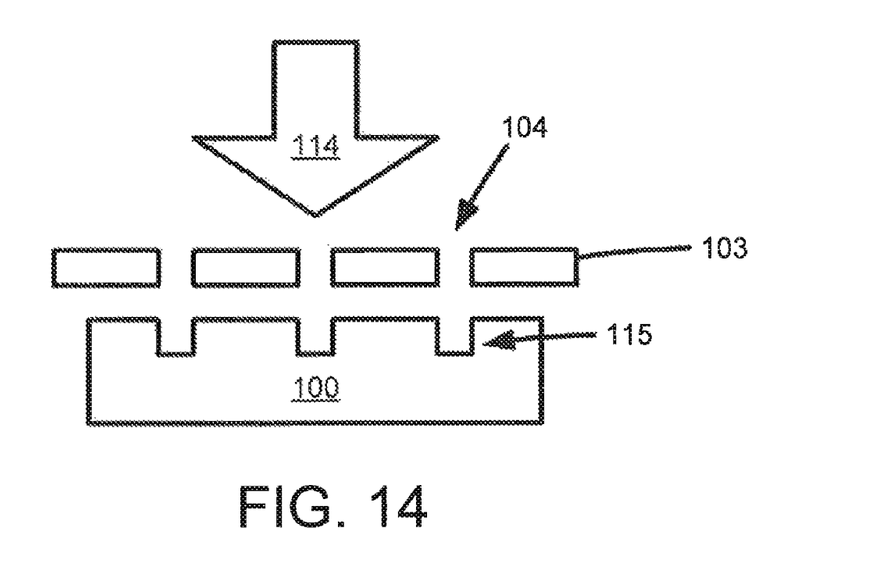
FIG. 14 is a cross-sectional view of an etching step.

FIG. 14 is a cross-sectional view of an etching step. In this embodiment, the first mask 103 is used with particles 114, which may be ions or neutral atoms or molecules. These form etched regions 115 that are aligned with the first apertures 104. A second mask may be used as described herein to form an etched region in a processed region or pattern similar to, for example, the implanted regions of FIGS. 5-9. This will leave independent non-etched or non-processed regions on the workpiece 100.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method to manufacture a workpiece comprising:
   directing a first species through a first aperture in a first mask toward a workpiece, said first mask spaced apart from said workpiece, wherein said first species is one of a n-type dopant and a p-type dopant;
   directing said first species through a second aperture in a second mask toward said workpiece, said second mask spaced apart from said workpiece, wherein said first species forms a pattern defining a plurality of independent regions surrounded by a processed region and wherein said processed region is a sum of said first species directed through said first aperture and said second aperture; and
   directing a second species into said independent regions through a third aperture in a third mask, wherein said second species is an opposite conductivity from said first species.

2. The method of claim 1, wherein said first species and said second species are ions and said directing is configured to implant said first species and said second species in said workpiece.

3. The method of claim 1, wherein each of said independent regions is surrounded by said processed region.

4. The method of claim 1, wherein said directing is configured to deposit said first species and said second species on said workpiece.

5. The method of claim 1, wherein said directing is configured to etch said workpiece with said first species and said second species.

6. The method of claim 1, wherein said processed region encompasses an entirety of a surface of said workpiece except for said plurality of independent regions.

7. The method of claim 1, wherein said second species forms doped regions, each of said doped regions within one of said independent regions and wherein said doped regions and said processed region define a gap therebetween.

8. A method to implant a workpiece comprising:
   selectively implanting a first ion species into a workpiece to form a first pattern, wherein said first ion species is selected from the group consisting of an n-type dopant and a p-type dopant;
   selectively implanting said first ion species into a workpiece to form a second pattern, said second pattern disposed between said first pattern, wherein said first pattern and said second pattern define a plurality of non-implanted regions surrounded by said first pattern and said second pattern; and
   selectively implanting a second ion species into said non-implanted regions, wherein said second ion species is an opposite conductivity from said first ion species.

9. The method of claim 8, wherein said selectively implanting to form said first pattern uses a first mask and said selectively implanting to form said second pattern uses a second mask, and wherein said first mask and said second mask each define at least one aperture.

10. The method of claim 9, wherein said first mask and said second mask are spaced apart from said workpiece.

11. The method of claim 9, wherein said second ion species is implanted using a third mask spaced apart from said workpiece.

12. The method of claim 8, wherein said first pattern and said second pattern encompass an entirety of a surface of said workpiece except for said non-implanted regions.

13. The method of claim 8, wherein said second ion species forms second doped regions, each of said second doped regions being within one of said non-implanted regions and wherein each of said second doped regions, said first pattern, and said second pattern define a gap therebetween.

14. A method to implant a workpiece comprising:
   selectively implanting a first ion species into a workpiece to form a first pattern;
   selectively implanting said first ion species into a workpiece to form a second pattern, said second pattern disposed between said first pattern, wherein said first pattern and said second pattern define a plurality of non-implanted regions encircled by said first pattern and said second pattern; and
   selectively implanting a second ion species different from said first ion species into said non-implanted regions.

15. The method of claim 14, wherein said selectively implanting to form said first pattern uses a first mask and said selectively implanting to form said second pattern uses a second mask, and wherein said first mask and said second mask each define at least one aperture.

16. The method of claim 15, wherein said first mask and said second mask are spaced apart from said workpiece.

17. The method of claim 15, wherein said second ion species is an opposite conductivity from said first ion species and wherein said second ion species is implanted using a third mask.

18. The method of claim 14, wherein said first ion species is selected from the group consisting of an n-type dopant and a p-type dopant and wherein said second ion species is an opposite conductivity from said first ion species.

19. The method of claim 14, wherein said first pattern and said second pattern encompass an entirety of a surface of said workpiece except for said non-implanted regions.

20. The method of claim 14, wherein said second ion species forms second doped regions, each of said second doped regions being within one of said non-implanted regions and wherein each of said second doped regions, said first pattern, and said second pattern define a gap therebetween.

* * * * *